United States Patent [19]

Fassett et al.

[11] 4,068,461
[45] Jan. 17, 1978

[54] DIGITAL ELECTRONIC ALARM WATCH

[75] Inventors: John R. Fassett, Irvine; Ivan V. Rondas, Mission Viejo; Joseph P. George, Huntington Beach; Claus Sondermann, Orange, all of Calif.

[73] Assignee: Frontier Inc., Newport Beach, Calif.

[21] Appl. No.: 677,192

[22] Filed: Apr. 15, 1976

[51] Int. Cl.$^2$ .......................................... G04B 19/30
[52] U.S. Cl. ........................... 58/23 R; 58/38 R; 58/57.5
[58] Field of Search ............ 58/21.12, 38, 57.5, 58/23 R, 23 A, 152 B; 331/114, 116; 340/384 R, 384 E; 310/8.1, 8.2, 9.1

[56] References Cited

U.S. PATENT DOCUMENTS

| | | | |
|---|---|---|---|
| 3,638,223 | 1/1972 | Potter | 340/384 E |
| 3,697,983 | 10/1972 | Potter | 340/384 E |
| 3,759,029 | 9/1973 | Komaki | 58/38 |
| 3,788,060 | 1/1974 | Kawamura | 58/38 |
| 3,872,470 | 3/1975 | Hoerz et al. | 340/384 E |
| 3,879,931 | 4/1975 | Tasuda et al. | 58/38 |
| 3,906,713 | 9/1975 | Suda et al. | 58/38 |
| 3,977,177 | 8/1976 | Egger | 58/57.5 |

Primary Examiner—Robert K. Schaefer
Assistant Examiner—Vit W. Miska
Attorney, Agent, or Firm—Knobbe, Martens, Olson, Hubbard & Bear

[57] ABSTRACT

A digital electronic wristwatch is provided with an alarm which includes a piezoelectric crystal mounted to vibrate a watch element. The piezoelectric crystal is supplied with a pair of signals, each having a peak voltage equal to that of the battery, but one of these signals is inverted, resulting in a peak-to-peak voltage which is higher than that normally available from the batteries located within the wristwatch housing. Such driving substantially increases the sound output of the crystal due to the effective voltage increase. A unique spring contact arrangement is used to connect the piezoelectric crystal to the watch electronics, and to permit easy removal of the piezoelectric crystal for battery replacement or watch repair. In addition, a flexible mounting arrangement increases the sound output from the alarm while providing water and dust protection for the watch.

10 Claims, 11 Drawing Figures

DIGITAL ELECTRONIC ALARM WATCH

BACKGROUND OF THE INVENTION

The present invention relates to digital electronic wristwatches and more particularly to an alarm mechanism for such watches which produces an audible sound to warn the wearer of the occurrence of a predetermined time.

Microelectronic circuitry has made possible the manufacture in increasing numbers of digital readout electronic wristwatches, many of which operate as completely solid state devices without moving parts or other mechanisms which limit the usable life of mechanical timepieces. Such watches are normally supplied with electrical power by one or two miniature batteries which are sufficient to drive the oscillators and counters used for controlling and storing a time count and for at least intermittently displaying the time. Prior art attempts, however, to integrate within the small confines of a wristwatch an audible alarm system have been relatively unsatisfactory. The primary difficulties which have prevented satisfactory alarm watches from being produced are the extremely tight physical space limitations combined with the power limitations imposed by the miniature batteries which must be utilized in these devices. As a consequence, prior art alarm wristwatches, while in some instances producing a barely audible alarm, have not in general produced a strong audio signal while at the same time conserving battery capacity.

An additional constraint which has not been satisfactorily overcome in the prior art is imposed by the fact that the optimum location for a vibrating alarm member within a watch structure is along the rear cover of the watch, that is, between the battery compartments and the rear cover. This presents difficulties in regard to the electrical connections which must be made to the vibrating alarm mechanism, since the watch back as well as the vibrating member must typically be removed in order to change the watch piece batteries. A satisfactory method for mounting the vibrating element and for electrically connecting this element to the electronic system of the watch has not heretofore been developed.

Prior art alarm watches using piezoelectric crystals as audio transducers have typically mounted such crystals against flat, rigidly mounted watch surfaces. The crystals in such watches must overcome not only the mechanical stiffness of the watch surface itself to vibrate this element and thereby provide an audible alarm, but must also overcome the increased vibration resistance caused by the rigid mounting of the watch surface. Thus, the sound output of such alarm is typically insufficient unless oscillating circuits, including space consuming inductors, are utilized.

SUMMARY OF THE INVENTION

The present invention alleviates these and other difficulties of the prior art by providing a bidirectional driving circuit which, in some mounting installations, requires a complete electrical isolation of the piezoelectric crystal used as the sound producing member. In the preferred embodiment, the signal is produced by a push-pull driving circuit which effectively doubles the driving voltage. In addition, the present invention utilizes a pair of spring elements passing through a battery support block for making electrical connections to the electrically isolated vibrating member while at the same time permitting a removal of this member, along with the watchcase back cover, for replacement of the watch battery.

The bidirectional driving of the piezoelectric crystal substantially increases the output of the crystal since it has been found that, for a predetermined available voltage, the sound emitted by such a crystal when driven in a bidirectional manner is significantly louder than the same crystal driven at an identical frequency in a monodirectional manner utilizing the same available voltage. This bidirectional driving, along with techniques which are disclosed for electrically isolating the piezoelectric crystal, has permitted the use of a transformerless, inductor free circuit for directly driving the piezoelectric crystal from solid state microcircuitry elements, the current drain for the alarm system being extremely small due to the high efficiency driving mode. The resulting alarm system is very efficient, requiring small current compatible with the miniature batteries within a wristwatch.

To further increase the audio output of the piezoelectric crystal, the present invention mounts this crystal on a thin, flat, resilient metal disc which forms a back for the watchcase, supported within a second perforated back which is exterior of the metallic disc back, the perforated watch back forming the outside back cover of the watch. The disc on which the piezoelectric crystal is mounted performs the function of a vibrating diaphragm moved toward and away from the perforated back by the piezoelectric crystal. Since the outer watch back is perforated, the flat disc is used to seal the watch housing against dust and liquids. In addition, an elastomeric substance is used to mount the flat disc diaphragm to the exterior watch back, this substance permitting free movement at the edges of the flat disc back and therey increasing the audio output of the alarm system for a predetermined applied voltage. The elastomeric material additionally performs the sealing function for the watch housing.

These and other advantages of the present invention are best understood through a reference to the drawings, in which.

DETAILED DESCRIPTION OF THE PREFERRED EMBODIMENT

Figure 1:
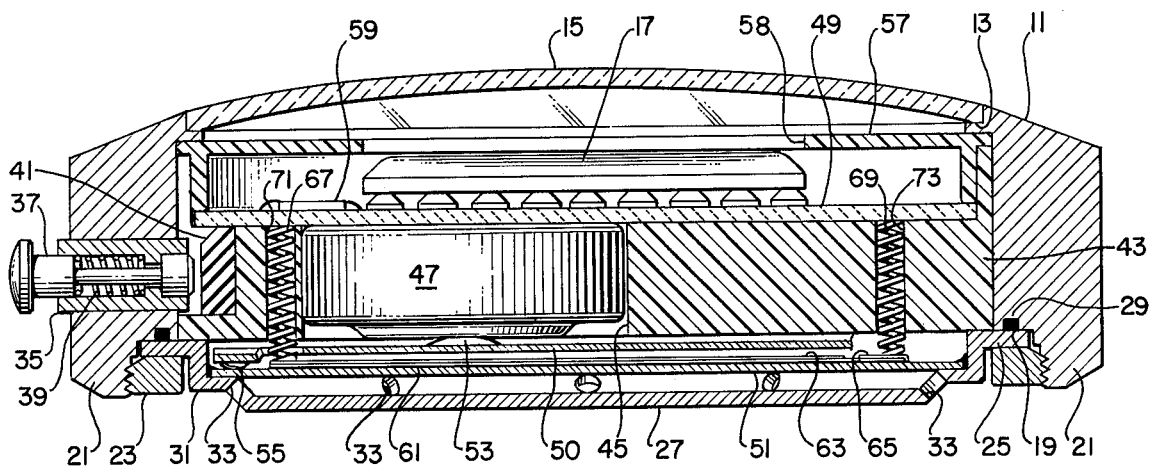
FIG. 1 is a sectional view of the alarm watch of the present invention.
Figure 4:
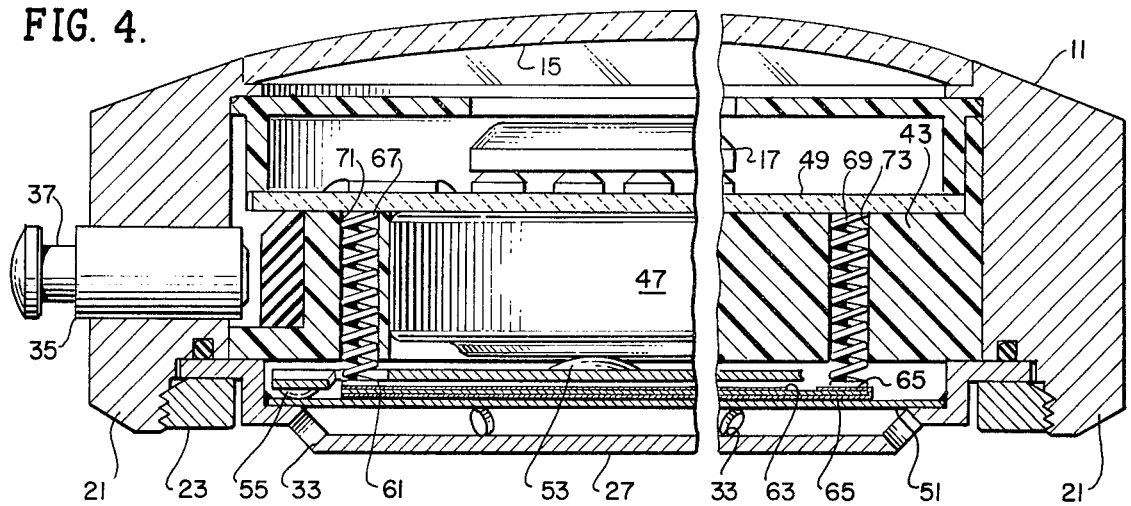
FIG. 4 is a sectional view similar to that of FIG. 1 and showing the watch of FIG. 1, this sectional view being enlarged and broken to permit description of detailed elements near the periphery of the watch structure.

Referring initially to FIGS. 1 and 4, the basic watch structure of the present invention is similar in most respects to the construction shown in patent application Ser. No. 613,151, filed Sept. 15, 1975, belonging to the assignee of the present invention. The description in that patent application is incorporated herein by reference. Essentially, the watch includes an outer annular main case member 11 which is open at the top and the bottom, the top opening provided with a shoulder 13 for supporting a crystal 15, at least a portion of which is transparent to permit the user to read the time displayed on a digital readout element 17. The open bottom end of the main case 11 is provided with a second shoulder 19 surrounded by an internally threaded extension 21. The threaded extension 21 receives an externally threaded ring nut 23 which holds a peripheral flange 25 extending from a main, exterior back cover 27 securely to the case 11. A sealing member, such as an O-ring 29, may be fitted in a groove in the main case member 11 to seal the flange portion 25 of the watch back 27 to the case 11. The crystal 15 is also sealed to the shoulder 13 to provide a sealed housing for the watch module. The exterior watch back 27 includes a beveled edge 31 adjacent the flange 25 which provides plural, circumferentially spaced apertures 33 for permitting the emission of alarm sound signals produced as described below.

The main watchcase member 11 is provided with one or more switching elements 35, each including a manually operable plunger 37 which is spring biased by a spring 39 to a position extending outwardly from the watchcase 11. When depressed, the plunger 37 contacts a resilient conductive member 41 to operate the functions of the timepiece. These switches 35 may be used in the present timepiece, for example, for reading out the time of day, for setting the watch to the proper time of day, for setting the alarm electronics within the watch to a predetermined time, or for reading the month and date or day of the week.

Fitted within the housing provided by the main watchcase 11, crystal 15 and watch back 27 is a main battery support block 43 which is typically provided with one or two apertures 45 for surrounding batteries 47. Each of the batteries is positioned to contact conductive printed pads on the rear face of a circuit substrate member 49 and to additionally contact a battery spring clip 50. The battery spring clip 50 may be provided with contact nodules 53 to assure adequate battery contact and may additionally be provided with a nodule 55 for providing contact between one terminal of the battery 47 and the case back 27. It will be understood that the case back 27, as well as the ring nut 23 and main watchcase member 11 are electrically conductive, such that the switches 35 are connected to the terminal of the battery 47 abutted by the nodule 53.

The battery support block 43 is attached to a plastic cover member 57 which includes an aperture 58 for providing viewing of the digital readout member 17. The electronic substrate 49 provides electrical interconnections and mechanical support for both the digital readout member 17 and plural other electronic elements, one of which is shown at 59. In addition, the resilient conductive members 41 are biased against the back face of the substrate 49 to provide direct electrical connection between the switches 35, when depressed, and conductive printed pads on the rear face of the substrate 49.

The present invention includes a secondary, interior watch back member 51, typically formed as a thin brass disc and sealed to the edge 31 of the perforated watch back 27 to seal the watch housing against foreign matter, such as dust and moisture. In the present embodiment, the brass disc 51 is attached to the watch back 27 by electrically conductive epoxy so that the battery spring clip 50 which makes electrical contact through the nodule 55 with the brass disc 51 can, in turn, provide current to the switches 35 through the exterior watch back 27 and main watchcase 11.

A flat disc of piezoelectric material 61 is provided with conductive electrode layers 63 and 65 on opposite flat faces and is attached in the present embodiment by nonconductive epoxy to the face of the brass disc 51. The conductive electrode layer 63 on the front face of the piezoelectric disc 61 covers the entire front face of the disc 61 with the exception of a small area adjacent the perimeter on one side of the disc 61. This area is utilized to bring the conductive electrode layer 65 around the edge of the disc 61 from the rear face of the disc 61 to permit electrical contact to both electrode layers 63 and 65 of the disc 61 from the front face only. The nonconductive epoxy used for connecting the piezoelectric disc 61 to the brass disc 51 allows complete electrical isolation of both sides of the piezoelectric disc 61 and permits the brass disc 51 to be used, through the nodule 55, as part of the main battery circuit for the switches 35.

A pair of springs 67 and 69 are housed within bores 71 and 73, respectively, in the battery support block 43 and extend from the circuit substrate 49 to the piezoelectric disc 61. The spring 67 contacts a conductive pad on the rear face of the circuit substrate 49 and conducts electricity therefrom to the front electrode layer 63 of the piezoelectric disc 61. The second spring 69 conducts current from a similar conductive pad on the rear face of the circuit substrate 49 to the rear electrode layer 65 of the piezoelectric disc 61 through the tab 65 extending onto the front face of the disc 61 around the edge thereof. The springs 67 and 69, therefore, provide electrical driving current from the circuit substrate 49 independently to the two electrode layered faces of the piezoelectric disc 61 while permitting a complete electrical isolation of each of these faces from the main watchcase 11 through the use of nonconductive epoxy. Since the battery support block 43 is formed of nonconductive material, the bores 71 and 73 therein provide connecting, nonconductive conduits for supporting the springs 67 and 69 and for permitting direct, simple interconnection between the substrate 49 and the crystal 61.

It will be recognized that the battery 47 may readily be changed by removing the ring nut 23 and the exterior perforated back 27, along with its attached brass disc interior back member 51 and piezoelectric disc 61, from the rear of the watch, the springs 67 and 69 remaining within the bores 71 and 73. The battery spring clip 50 is typically resiliently attached to the battery support block 43 and must be removed for access to the batteries 47. The present structure thus provides ready battery removal while still providing adequate sealing for the internal watch housing by the connection of the brass disc 51 to the perimeter flange of the back 27, and electrical isolation for the disc 61.

Figure 2:
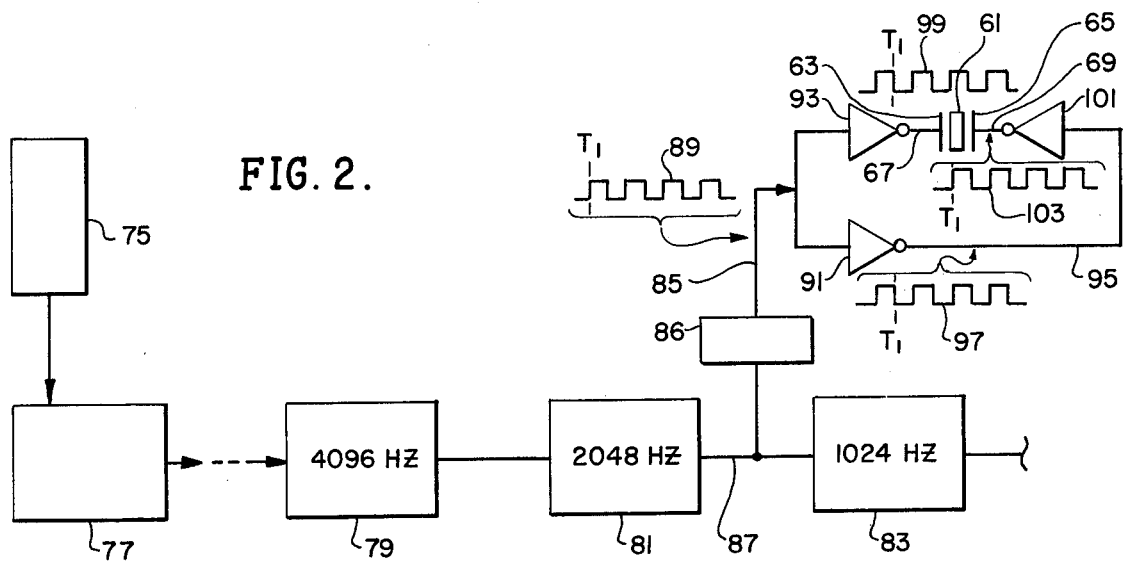
FIG. 2 is a schematic block diagram showing the driving circuit used in the watch of FIG. 1 for driving the audible alarm.

Referring now to FIG. 2, the electronic circuit which is printed and mounted on the circuit substrate 49 of FIGS. 1 and 4 and is used for driving the piezoelectric crystal 61 to produce an audible alarm tone will be described. It will be understood by those skilled in this art that the circuit substrate 49 includes all of the necessary electronics for operation of the watch as well as the alarm circuit. This alarm circuit is not shown in the drawings of this application but typically includes a memory device which is settable and which stores the time at which the watch alarm is to be sounded. This memory device is compared with the actual time of day which is likewise stored in a memory or counter and is updated periodically. When the time of day equals the alarm setting time, the alarm of the present invention is activated to notify the wearer. FIG. 2 includes the primary oscillator 74 which is used as a time base for the electronic watch. In a typical fashion, the output frequency of this oscillator 75 is supplied to a divider chain including the dividers 77 through 83 and plural additional dividers, each of which typically divides its input frequency by two to produce an output at one-half the frequency of the input. Thus, for example, the divider 79 is responsive to an input signal at 8192 Hz and produces an output signal at 4096 Hz. It will be understood that this divider chain comprises many additional dividers but that the three divider networks 79, 81 and 83 have been shown since these dividers produce output signals in the audio frequency range which are particularly useful in operating the alarm of the present invention. Specifically, the output of the divider 81 is a square wave at 2048 Hz. The present invention makes use of this square wave already present in the standard watch circuitry for driving the piezoelectric crystal 61.

As shown in FIG. 2, this square wave is used to drive the crystal 61 in a push-pull, double ended manner to substantially increase the transducer acoustical power and thus enable the microminiature circuitry to operate the tone mechanism. A conductor 87 is connected through a control logic member 86 to the conductor 85 which provides the driving circuitry with a square wave as shown at 89. The control logic member 86 serves as a gate to provide audible tones at the time when the alarm is to sound, and may be used to turn the audio signal on and off, for example, at a 2 Hz rate to make the sound more noticeable. The square wave from the control logic member 86, as mentioned previously, has a frequency of 2048 Hz and varies from 0 to +3 volts, it being assumed that a pair of 1.5 volt batteries 47 are utilized in the watch structure and are connected in series for powering the divider chain 77 through 83 and control logic 86. The signal shown at 89 is identified with a time $T_1$ for illustrative purposes, as will become more apparent with further discussion. This signal on line 85 is applied in parallel to a pair of inverters 91 and 93, each of which produces a square wave at 2048 Hz varying between 0 and +3 volts and inverted from the signal 89. The output of the inventor 91 is coupled to a lead 95 and is shown diagrammatically at 97. The output of the inverter 93 is on the spring element 67 shown in FIGS. 1, 2 and 4. This output signal is shown diagrammatically at 99, and varies from 0 to +3 volts. It will be seen that each of the inverted signals 97 and 99 is identified by the time $T_1$ at the trailing edge of a pulse, this time $T_1$ being identical to the time $T_1$ identified in the wave form 89. The output wave form on the line 95 is coupled to a third inverter 101 which produces on its output, which is coupled to the spring 69 shown in FIGS. 1, 2 and 4, a wave form shown diagrammatically at 103. The wave form 103 has been inverted, so that the time $T_1$ appears at the leading edge of a square wave pulse. It will be understood that the two inverters 93 and 101 operate as buffers to electrically isolate the piezoelectric crystal 61 from the line 85 and to supply current for driving this crystal 61 from its associated electrodes 63 and 65.

Figure 3:
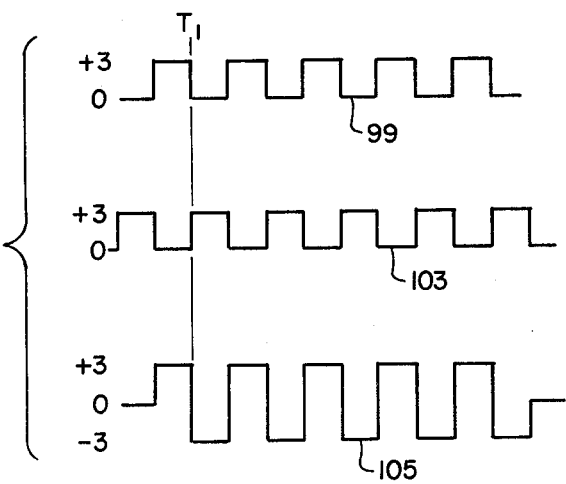
FIG. 3 is a pictorial diagram of wave forms existent on different conductors of FIG. 2.

Referring now to FIG. 3, the square wave 99 which appears on spring 67 and the square wave 103 which appears on the spring 69 are again diagrammed, along with the resulting effective peak-to-peak wave form 105 which appears across the piezoelectric crystal 61 as a consequence of the push-pull, complementary use of the wave forms 99 and 103. It will be seen from the wave form 105 that the effective resultant voltage across the piezoelectric crystal 61 varies between +3 volts in one polar direction and +3 volts in the alternate polar direction, equivalent to −3 volts, so that a 6 volt peak-to-peak wave form at 2048 Hz is produced for driving the crystal 61.

It has been found that, through the application of the signal 105 of FIG. 3, it is possible by using the microcircuitry on the substrate 49, without space consuming inductor members, to efficiently drive the crystal 61 without a separate driving source as is usually required in alarm watches. It will be recognized, additionally, from a review of FIG. 2, that in order to apply the wave forms 99 and 103, both electrodes 63 and 65 of the piezoelectric crystal 61 must be driven from 0 to +3 volts, which requires that the piezoelectric crystal 61 be electrically isolated from the main watchcase 11 which, as previously described, is normally maintained by the battery spring clip 50 at a voltage of 1.5 volts. This is the reason for the dual spring contacts 67 and 69 shown in FIG. 1, as well as the nonconductive epoxy utilized for connecting the piezoelectric crystal 61 to the brass disc 51.

Figure 5:
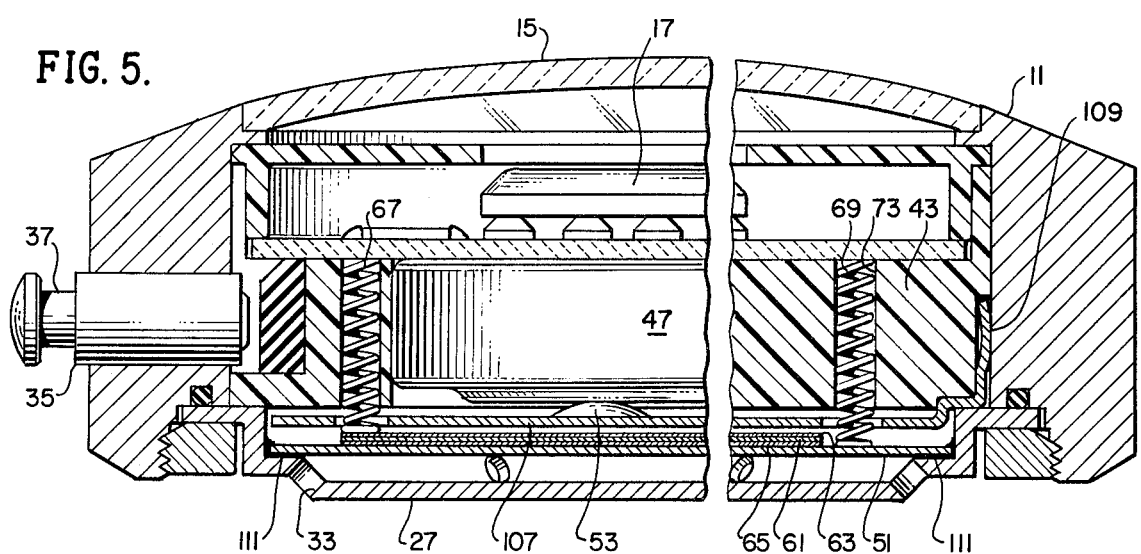
FIG. 5 is a broken sectional view similar to that of FIG. 4 and showing an alternate embodiment for electrically connecting the piezoelectric alarm crystal for the watch.

Referring now to FIG. 5, an alternate embodiment of the present invention which permits electrical isolation of the piezoelectric crystal for driving with a circuit as shown in FIG. 2 will be described. In this instance, a battery spring clip 107, rather than being connected to the main watchcase 11 through the brass disc 51, includes an offset tab 109 which fits between the battery support block 43 and the main watchcase 11 to carry current directly from the battery 47 and contact nodule 53 to the case 11. With this type of battery clip 107, it is not necessary to use the brass disc 51 as a portion of the conductive path for energizing the watchcase 11, so that the entire brass disc 51 can be isolated from the watch back 27. In this instance, nonconductive epoxy 111 is used to attach the brass disc 51 to the periphery of the watch back 27. The springs 67 and 69 are still used to make electrical contact with the electrodes 63 and 65 on the sides of the piezoelectric crystal 61. In this embodiment, however, the electrode 65 is connected by conductive epoxy to the brass disc 51 rather than by nonconductive epoxy. The brass disc 51 thus becomes a terminal for the rear face of the piezoelectric crystal 61 and the spring 69 directly contacts the brass disc 51. The remaining spring 67, as with the embodiment of FIGS. 1 and 4, contacts the electrode 63 on the front face of the crystal 61 for making the remaining electrical connection. As with the prior embodiment, the back 27 may be removed from the watch of FIGS. 5, carrying with it the brass disc 51 which will release from the springs 67 and 69. The battery clip 107 may then be removed from the back of the watch, the conductive tab 109 being released from its position between the battery support block 43 and watchcase 11, so that the batteries 47 may be replaced. In all other characteristics, the watch of FIG. 5 is identical to the watch of FIGS. 1 and 4, the piezoelectric crystal 61 being electrically isolated from the main watchcase 11 so that it may be driven in a push-pull manner by the circuit of FIG. 2. The only difference in this embodiment is that the brass disc 51 is also isolated from the watchcase 11 so that it may be used as one of the contact terminals for the piezoelectric crystal 61.

Figure 6:
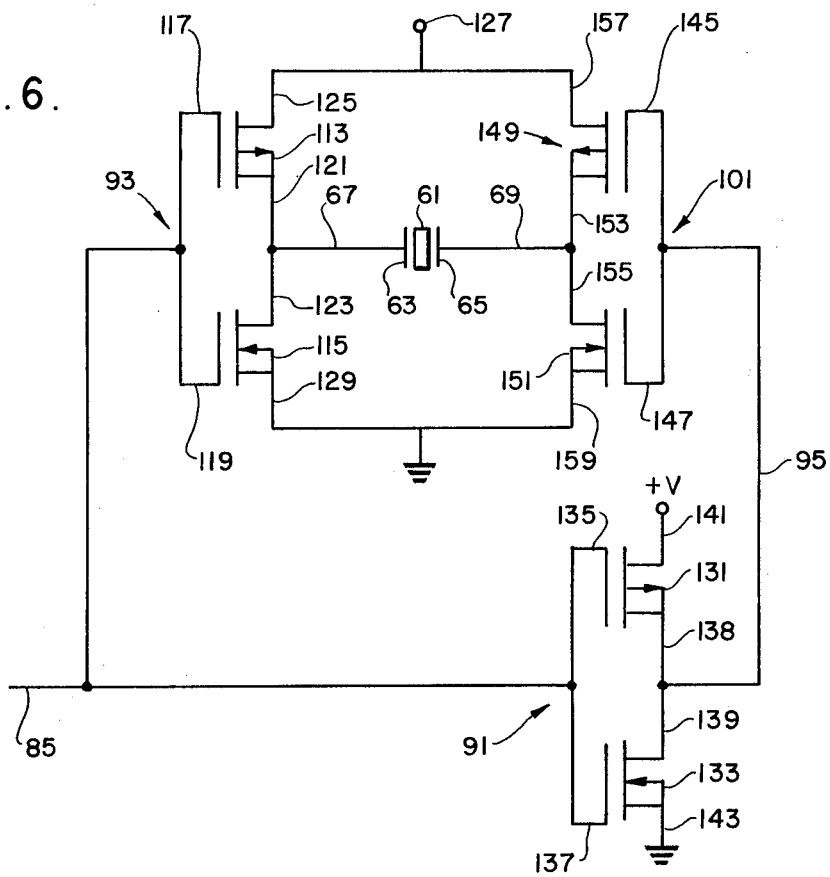
FIG. 6 is a detailed electrical schematic showing the crystal driving portion of the circuit of FIG. 2.

Referring now to FIG. 6, the detail MOS circuitry utilized in constructing the buffer and driver inverters 91, 93 and 101 of FIG. 2 will be explained. The inverter 93 includes a pair of MOS transistors 113 and 115, the gate electrodes 117 and 119 of these devices being connected to the input conductor 85 which carries the 2048 Hz signal from the divider chain to the buffer inverter network through the control logic 86. The MOS transistor 113 is a P-channel device while the transistor 115 is an N-channel device, the source 121 of the device 113 and drain 123 of the device 115 being connected to the spring conductor 67 which is attached to the electrode 63 of the piezoelectric transducer 61. The drain 125 of the transistor 113 is connected to a positive 3 volt power supply terminal 127.

The source terminal 129 of the transistor 115 is connected to ground. In a similar manner, the inverter 91 includes a P-channel MOS transistor 131 and an N-channel MOS transistor 133, the gates 135 and 137 of these devices being connected in parallel to the input conductor 85. The source terminal 138 and drain terminal 139 of the devices 131 and 133, respectively, are connected to the output line 95 of the inverter 91 while the drain terminal 141 of the transistor 131 is connected to a +3 volt potential. The source terminal 143 of the transistor 133 is potential. The source terminal 143 of the transistor 133 is connected to ground. The drain terminal 141 of the transistor 131 is permanently attached to the source of +3 volt potential. The output line 95 from the inverter 91 drives the gate terminals 145 and 147 of a P-channel MOS transistor 149 and an N-channel MOS transistor 151, respectively, of the inverter 101. The source terminal 153 of the transistor 149 and drain terminal 155 of the transistor 151 are connected to the second electrode 65 of the piezoelectric crystal 61. The drain terminal 157 of the transistor 149 is connected to the terminal 127, while the source terminal 159 of the transistor 151 is connected to ground.

The operation of the circuit of FIG. 6 is as follows. As previously explained, a square wave at an audio frequency such as 2048 Hz is applied to the input conductor 85 and varies between 0 and 3 volts. When the signal on line 85 is at a +3 volt potential, initiated by the control logic 86, the MOS transistors 113, 151 and 131 are nonconductive while the MOS transistors 115, 149 and 133 are conductive. The output line 95 from the inverter 91 is thus clamped to ground. The output of the inverter 93 on spring conductor 67 is likewise clamped to ground, while the output of the inverter 101 on the spring conductor 69 is maintained at a +3 volt potential so that the electrode 65 is at +3 volts while the electrode 63 is at ground. In the remaining half cycle of the square wave input, when the line 85 is clamped to ground, the MOS transistors 113, 151 and 131 are conductive while the transistors 115, 149 and 133 are nonconductive. The output line 95 from the inverter 91 is clamped to +3 volts, as is the output spring conductor 67 from the inverter 93, while the output spring conductor 69 from the inverter 101 is clamped to ground. In this condition, the electrode 63 is maintained at a +3 volt potential while the electrode 65 is maintained at ground, reversing the polarity across the piezoelectric crystal 61 and energizing this crystal as shown by the wave form 105 of FIG. 3. The inverters 91 and 93 act as buffer drivers in this circuit to isolate the crystal 61 from the conductor 85 and thus from the divider chain used in the primary watch circuit, and to drive the piezoelectric crystal 61.

Figure 7:
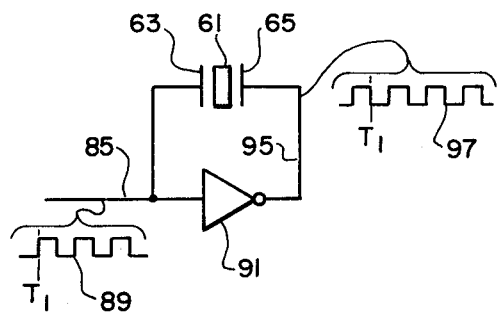
FIGS. 7 and 8 show a schematic block diagram and detailed schematic view, respectively, of an alternate electronic circuit for driving the piezoelectric crystal of the present invention.
Figure 8:
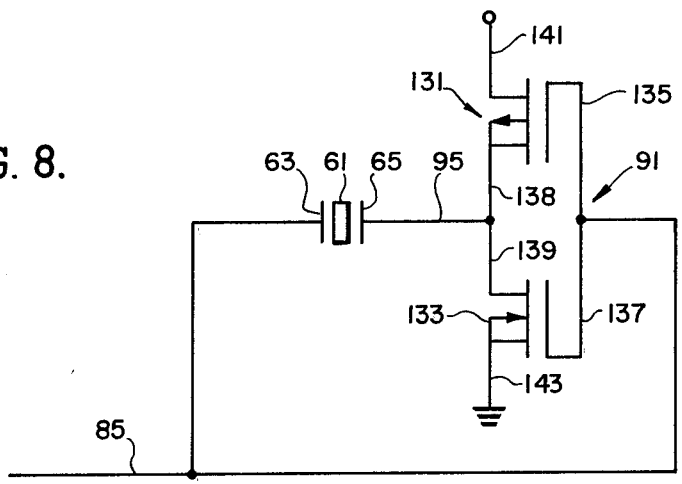

FIGS. 7 and 8 illustrate an alternative driving circuit which may be utilized to replace the circuit shown in FIGS. 2 and 6. Thus, if the output produced by the control logic 86 of FIG. 2 is sufficient for directly driving the piezoelectric crystal 61, the circuits of FIGS. 7 and 8 may be utilized as a simpler push-pull driver. Referring to FIG. 7, it will be seen that this figure is identical to the driver portion of FIG. 2, except that the pair of buffering inverters 93 and 101 have been deleted. As in the case of FIG. 2, line 85 conducts a square wave 89 from the control logic 86 which has the leading edge of a positive voltage pulse at time $T_1$. The inverter driver 91 produces on an output line 95 the square wave 97 having the trailing edge of a positive voltage pulse occurring at time $T_1$, so that whenever the input conductor 85 is positive, the conductor 95 is clamped to ground. Alternatively, whenever the input conductor 85 is clamped to ground, the conductor 95 is maintained at a positive voltage level. Thus, the piezoelectric crystal 61, through the electrodes 63 and 65, is driven in a push-pull manner with a signal as shown at 105 of FIG. 3.

FIG. 8 illustrates the detailed circuitry for the driver inverter 91 of FIG. 7, and it will be seen that the detailed construction is identical to that of the inverter 91 shown in FIG. 6, the elements being identically numbered.

Figure 9:
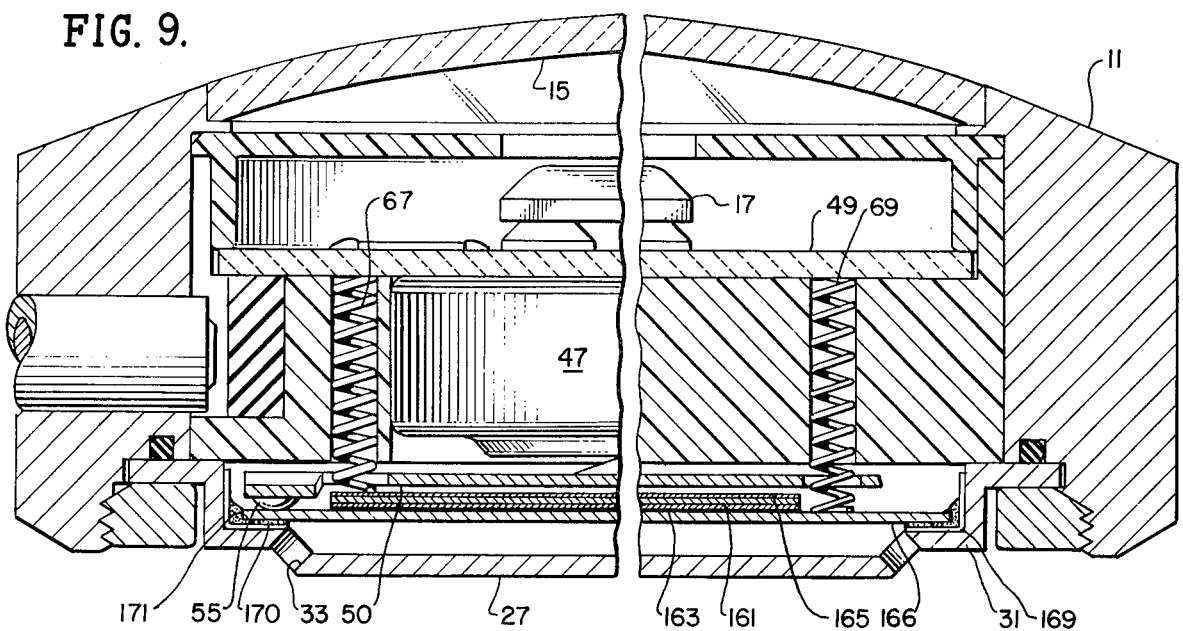
FIG. 9 is a broken sectional view similar to that of FIGS. 4 and 5, showing an improved mounting structure for the piezoelectric crystal of the present invention.

FIG. 9 shows a preferred alternate embodiment for mounting the piezoelectric alarm in the watch. In this instance, the watch structure is substantially identical to that shown in FIGS. 1 and 4 and like elements are numbered identically, except that the manner of attaching a piezoelectric crystal with electrodes 163 and 165 and its attached flat brass disc 166 to the shoulder 31 of the exterior perforated watch back 27 permits unrestricted movement of the brass disc 166 and piezoelectric crystal 161, increasing the resulting sound output of the alarm system.

In this embodiment, as with the embodiment of FIGS. 1 and 4, a pair of springs 67, 69 make contact between the substrate 49 and the alarm mechanism. Specifically, the spring 67 directly contacts the electrode material 165 on the inner surface of the piezoelectric crystal 161. The spring 69 contacts the flat conductive brass disc 166 to apply driving signals to the electrode material 163 on the exterior face of the crystal 161. As with the embodiment of FIG. 1, conductive epoxy is used to attach the electrode layer 163 to the disc 166 to permit driving by the spring 69.

It is likewise important, in order to use the driving electronics described in reference to FIGS. 2, 6, 7 and 8, that the brass disc 166 can be electrically isolated from the remainder of the watch housing. In order to accomplish these purposes, the space between the disc 166 and the shoulder 31 includes plural, tangentially spaced, L-shaped insulating members 169 formed of relatively rigid, impact resistant, polymer material. In addition, a peripheral bead or projecting rim of relatively pliable elastomeric material 170 forms a continuous support around the circumference of the disc 166 to support the disc 166 above the shoulder 31 and insulating members 169. A fillet 171 of similar, relatively pliable, elastomeric material may be used to fill the space between the outer perimeter of the disc 166 and the facing edge of the shoulder 31 to seal the disc 166 to the shoulder 31.

It can be seen, therefore, that through the sealing fillet 171, the disc 166 which is unperforated becomes the dust and moisture barrier for the watch housing, permitting the apertures 33 in the perforated watch back 27 to conduct alarm sounds while not interfering with the hermetic integrity of the watch housing.

Both the bead 170 and fillet 171, however, are formed of relatively soft, pliable, elastomeric material so that, as the crystal 161 is energized by the bidirectional driving circuit, it can flex the brass disc 166 between the flat configuration shown in FIG. 9 and a domed configuration, the dome alternatively directed toward and away from the watch housing, without rigid edge constraint. It will be recognized through a study of FIG. 9 that if, as is common in the prior art, the perimeter of the brass disc 166 were rigidly attached to the shoulder 31 either by encapsulating this perimeter in rigid epoxy or by clamping it between mechanical elements, a cantilever-type mounting would exist at all perimeter locations, increasing the resistance of the brass disc 166 to the dome-type flexing required for the production of an audible alarm signal. The resilient fillet 171 and bead 170, however, perform the function of attaching the disc 166 to the shoulder 31 without rigidly mounting the perimeter of the disc 166, and thus permit the disc 166 to flex in a normal, unrestrained manner, with the dome flexure occurring from the edge of the disc rather than from a cantilever mount, so that the audio output signal produced by a given electrical driving signal is increased.

Figure 10:
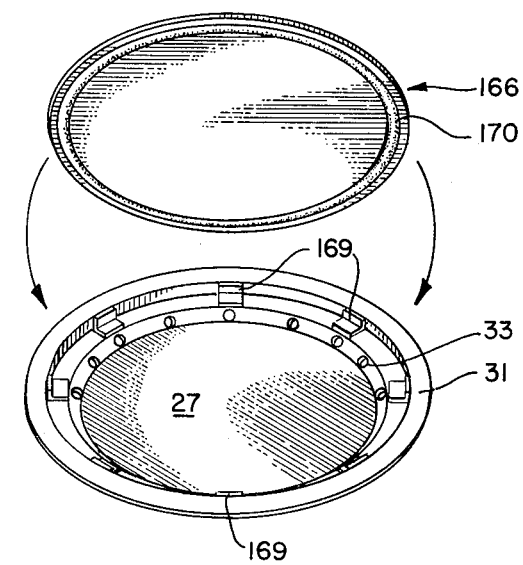
FIG. 10 is an exploded view showing one step in a method used to construct the mounting structure of FIG. 9.

Referring now to FIG. 10 the method used for constructing the watch back of the present invention to accomplish this resilient mounting will be described. Initially, perforated, external back 27 and, in particular, the perimeter shoulder 31 thereof, is coated at spaced tangential locations, such as the eight such locations shown in FIG. 10, with a relatively rigid, impact resistant polymer material 169. This material 169 could be placed around the entire perimeter of the watch back 27, but need be placed only at sufficient locations to insure that, even if the brass disc 166 vibrates through the fillet 171, it cannot contact the shoulder 31 of the watch back 27. Such contact would short out one electrode 163 of the crystal 161 to the watch housing. Thus, for example, if tolerances are maintained to a sufficient degree, three such spaced insulators 169 would be sufficient. The peripheral bead 170 of relatively soft, pliable, elastomeric material is then applied to the exterior face of the brass disc 166 surrounding the entire perimeter thereof. The elastomeric bead 170 may be formed, for example, of silicone rubber material applied to the brass disc 166 in a liquid form and cured thereon to form the resilient bead 170. The bead 170 should be thick enough so that, during vibration of the disc 166, no surface of this disc 166 can contact either the shoulder 31 or the insulators 169.

Figure 11:
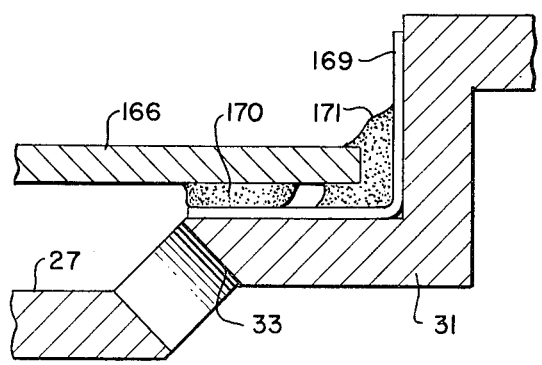
FIG. 11 is an enlarged partial sectional view of the peripheral portion of the watch back members of FIG. 9, illustrating another step in the method used to construct the mounting structure thereof.

As shown in FIG. 11, the brass disc 166 with its perimeter elastomeric bead 170 is next placed against the shoulder 31 of the watch back 27. It will be recognized that the bead 170 may not be sufficiently resilient to fill all of the voids around the insulating members 169 and, since it is applied to the shoulder 31 after curing, will not perform the required sealing of the watch housing. For this reason, the fillet material 177 is applied around the perimeter of the brass disc 166 after placement against the shoulder 31. The fillet material 171 is also preferably formed of silicone rubber applied to the structure in a liquid state to form a continuous fillet around the perimeter of the brass disc 166, this material being cured after application to form not only a dust and moisture barrier for the watch housing but also to hold the disc 166 in position within the perforated watch back 27. While in many applications the resilient mounting material 170, 171 would be sufficient for sealing and mounting the disc 166, the insulating members 169 assure that, even if the disc 166 through successive vibrations were to creep or pound its way through either of the elastomeric rings 170, 171, it will nevertheless always be electrically insulated from the shoulder 31 and thus from the watch housing. Even if this were to occur, the brass disc 166 would still be relatively free to flex all the way to its perimeter edge, so that the acoustical output of the piezoelectric disc 161 would not be impeded.

It has been found that the springs 67 and 69 used for biased contact between the substrate 49 and piezoelectric ceramic disc must have sufficient preload to resist bouncing from the surface of the piezoelectric ceramic disc 161 or brass disc 166 when the alarm is driven, but at the same time the preload must be low enough so that the springs 67 and 69 do not interfere with normal flexing of the brass disc 166 and piezoelectric disc 161. The prior art has generally found it necessary to use a flexible, nonresilient interconnection to the face of piezoelectric discs in alarm watches in order to avoid any circuit discontinuities during actual vibration of the piezoelectric disc. In the present invention, however, the springs 67 and 69 are sufficiently long and flexible, and have a sufficiently low mass to permit the disc 166 to vibrate without causing any circuit discontinuities. The resilient mount formed by the perimeter layers 170 and 171 assists this overall operation by assuring that, during vibration, some resilient cushioning is nevertheless present in the brass disc 166, so that the springs 67 and 69 are urged against a somewhat yieldable member, decreasing the likelihood of circuit discontinuities.

It has also be observed that, in some watches, a jarring of the watch structure can cause mechanical flexure of the piezoelectric disc 161, producing unwanted electrical signals from the disc 161 through the terminals 67 and 69 into the watch electronics on the substrate 49, interfering with normal operation of the digital circuitry thereon. The elastomeric mount of the present embodiment cushions shocks applied to the watch housing so that they are not directly applied to the piezoelectric disc 161, reducing the resulting voltages produced by this disc. Thus, the soft mount for the alarm assembly, in addition to increasing the audible output of the alarm, shields this alarm from mechanical shocks which would otherwise interfere with normal watch operation.

It will be appreciated by those skilled in the art that any audio frequency available or synthesized from the divider chain may be used to drive the piezoelectric crystal of the present watch. Thus, for example, the frequency 2048 Hz is used in the embodiment of FIG. 2, although any other frequency may be connected to the control logic 86, if desired. In each case, however, the crystal will operate as a more effective sound producing element if it is cut to have a natural resonance at the driving frequency.

What is claimed is:

1. A method of driving a piezoelectric, audible tone producing crystal of a wristwatch, comprising:
   producing an audio frequency signal, said producing step comprising:
      generating in a crystal controlled oscillator the fundamental time base signal for said wristwatch;
      dividing said fundamental time base signal by a factor which produces an audio frequency signal; and
      utilizing said audio frequency signal for driving the time keeping functions of said wristwatch and for driving said audible tone producing crystal; and
   noninductively applying said signal to said crystal to induce an alternating polarity potential to said crystal, said applying step comprising:
      inverting said audio frequency signal to produce an inverted audio frequency signal;
      conducting said audio frequency signal to a first terminal of said piezoelectric crystal; and
      conducting said inverted audio frequency signal to a second terminal of said piezoelectric crystal.

2. A method of driving a piezoelectric, audible tone producing crystal of a wristwatch as defined in claim 1 wherein said crystal is a flat disc with surface electrodes on opposite flat faces, said method additionally comprising:
   indepently driving each of said surface electrodes.

3. An electronic digital alarm wristwatch in which a piezoelectric crystal is energized with an alternating current signal to generate an audible alarm tone, comprising:
   a digital electronic circuit for producing a first alternating current signal varying between ground potential and a second potential at an audio frequency, said digital electronic circuit comprising:
      a crystal oscillator utilized as the fundamental time base for said wristwatch; and
      means for dividing said fundamental time base signal by a factor sufficient to produce said first alternating current signal; and
   noninductive solid state circuit means responsive to said first alternating current signal for alternately applying a positive and negative voltage across said piezoelectric crystal to drive said crystal in a bidirectional manner.

4. An electronic digital alarm wristwatch as defined in claim 3 additionally comprising:
   spring conductor means removably biased between said solid state circuit means and said piezoelectric crystal for applying said positive and negative voltage to said crystal.

5. An electronic digital alarm wristwatch as defined in claim 3 wherein said noninductive solid state circuit means comprises:
   an inverter coupled between said first alternating current signal and a first terminal of said piezoelectric crystal; and
   means for conducting said first alternating current signal to a second terminal of said piezoelectric crystal.

6. An electronic digital alarm wristwatch as defined in claim 5 wherein said means for conducting said first alternating current signal to said second terminal comprises a pair of inverters connected in series between said first alternating current signal and said second terminal.

7. An electronic digital alarm which including a piezoelectric crystal having a pair of electrodes for producing an audible tone, comprising:
   a watchcase;
   circuit means mounted within said watchcase for driving said piezoelectric crystal, said circuit means comprising a noninductive solid state bidirectional driver circuit comprising:
      the fundamental time base oscillator for said electronic wristwatch; and
      means for dividing said fundamental time base frequency to produce an alternating current signal at an audio frequency;
   means for mounting said crystal to said watchcase, said means electrically isolating said crystal from said watchcase; and
   means for connecting said pair of crystal electrodes to said circuit means independent of said watchcase.

8. An electronic digital alarm wristwatch having a piezoelectric crystal alarm element including a pair of surface electrodes for producing an audible alarm tone, comprising:
   means for producing an alternatively current signal at an audio frequency, said means comprising:
      the fundamental time base oscillator for said electronic wristwatch; and
      means for dividing said fundamental time base frequency to produce said alternating current signal at an audio frequency;
   means for applying said alternating current signal to one of said surface electrodes of said piezoelectric crystal; and
   an inverter connected between said alternating current signal and the other of said surface electrodes of said piezoelectric crystal.

9. An electronic digital alarm wristwatch as defined in claim 8 wherein said means for applying said alternating current signal to one of said surface electrodes comprises a pair of inverters series connected between said means for producing an alternating current signal at an audio frequency and said one of said surface electrodes of said piezoelectric crystal.

10. An electronic digital alarm wristwatch as defined in claim 8 wherein said means for applying said alternating current signal to one of said surface electrodes comprises a resilient conductive spring member removably biased against said one of said surface electrodes and connected to said means for producing an alternating current signal.

* * * * *

UNITED STATES PATENT AND TRADEMARK OFFICE
CERTIFICATE OF CORRECTION

PATENT NO. : 4,068,461

DATED : January 17, 1978

INVENTOR(S) : John R. Fassett, Ivan V. Rondas, Joseph P. George, Claus Sondermann It is certified that error appears in the above-identified patent and that said Letters Patent are hereby corrected as shown below:

Column 10, line 54, change "be" to --been--.

Column 11, line 41, change "indepently" to --independently--

Signed and Sealed this

Twenty-third Day of May 1978

[SEAL]

Attest:

RUTH C. MASON
Attesting Officer

LUTRELLE F. PARKER
Acting Commissioner of Patents and Trademarks